(12) United States Patent
Oxsen et al.

(10) Patent No.: US 7,516,507 B1
(45) Date of Patent: Apr. 14, 2009

(54) INTEGRATED MEGASONIC CASCADE SCRUBBER MODULE AND PROCESS

(75) Inventors: Michael Oxsen, San Jose, CA (US);
Scott Petersen, Scotts Valley, CA (US);
Yassin Mehmandoust, Santa Cruz, CA (US)

(73) Assignee: Xyratex Technologies, Ltd., Havant Hampshire (GB)

( * ) Notice: Subject to any disclaimer, the term of this patent is extended or adjusted under 35 U.S.C. 154(b) by 800 days.

(21) Appl. No.: 10/984,321

(22) Filed: Nov. 8, 2004

Related U.S. Application Data

(60) Provisional application No. 60/518,804, filed on Nov. 10, 2003.

(51) Int. Cl.
*B08B 11/02* (2006.01)
(52) U.S. Cl. .............................. 15/77; 15/21.1; 15/102
(58) Field of Classification Search ................. 15/21.1, 15/77, 102
See application file for complete search history.

(56) References Cited

U.S. PATENT DOCUMENTS

| | | | |
|---|---|---|---|
| 6,295,999 B1 | 10/2001 | Bran | |
| 6,457,199 B1 * | 10/2002 | Frost et al. | ............ 15/77 |
| 6,588,043 B1 | 7/2003 | Frost et al. | |
| 6,625,835 B1 | 9/2003 | Front et al. | |
| 6,678,911 B2 * | 1/2004 | Krupa et al. | ............ 15/77 |
| 7,007,333 B1 * | 3/2006 | Mikhaylichenko et al. | ...... 15/77 |
| 2003/0061675 A1 * | 4/2003 | Sugarman | ............ 15/77 |

OTHER PUBLICATIONS

"Acoustic Property Characterization of a Single Wafer Megasonic Cleaner" by Wu, Franklin, Bran and Fraser, paper presented in Honolulu, HI in Oct. 1999.
"Goldfinger CMP Single Wafer Post-CMP Clean," A Power Point Sales presentation by Verteq Inc. in 1998/1999.

* cited by examiner

*Primary Examiner*—Randall Chin
(74) *Attorney, Agent, or Firm*—Innovation Law Group, Ltd; Jacques M. Dulin, Esq.

(57) ABSTRACT

Substrate preparation systems comprising multi-zone cascade brush scrubbers having sonic assemblies disposed between one or more of the scrubber zones for cleaning of disk-shaped substrates, including silicon wafers and disks for data storage devices, such as hard disk drives (HDD), compact discs (CD) and digital video discs (DVD). The system method combines a sonic particle dislodgement/removal assembly into a cascade brush scrubber line comprising a longi-tudinal array of brush pairs in which the substrates process through preparation zones defined by each pair of brushes, the substrates being transited longitudinally through the zones while rotating on an axis normal to their faces. Piezoelectric transducer arrays transmit sound energy to one or both face(s) of the substrate to dislodge and/or remove particles, and the scrubber simultaneously or thereafter sweeps away the particulates. The sonic energy may be ultrasonic, megasonic, or both, applied to the substrate surface(s) in alternating or sequential process steps.

12 Claims, 4 Drawing Sheets

INTEGRATED MEGASONIC CASCADE SCRUBBER MODULE AND PROCESS

CROSS REFERENCE TO RELATED APPLICATION

This is the Regular US patent application of prior Provisional Application Ser. No. 60/518,804 filed Nov. 10, 2003 by the same inventors under the same title, priority of which is hereby claimed under 35 US Code Section 119, 120, ff, and the disclosure of which is hereby incorporated by reference.

FIELD

This invention is directed to substrate preparation cleaning systems and methods, and more particularly to apparatus and methods for cleaning of disk-shaped substrates, including silicon wafers of the type used in the fabrication of computer chips, and aluminum, ceramic, plastic, glass and multi-component disks for data storage devices such as hard disk drives (HDD), compact discs (CD), digital video discs (DVD), and the like, used in the computer, information and entertainment industries.

BACKGROUND

The computer, information, and entertainment industries produce and consume annually hundreds of millions of disk-shaped substrates, principally silicon wafers, and aluminum, plastic, glass, or other multi-component disks. In the fabrication of computer CPU chips, silicon wafers are processed through multiple fabrication steps which include repeated application and selective removal by CMP and scrubbing of variously conductive, non-conductive and semi-conductive materials before the resulting micro-circuits are complete and separated into individual dies.

Aluminum, glass, and other composite disk substrates are typically over-coated with magnetic, optical, or magneto-optical materials in the fabrication of HDDs, CDs, DVDs, and other data storage products.

Substrates must be buffed, polished, etched, cleaned, and otherwise prepared repeatedly during the fabrication process. This is true for both wafer and disk substrates. In the semiconductor manufacturing industry, integrated circuit devices designed with complex, and extremely fine and precise multi-layered structures, require highly clean and prepared surfaces.

In the field of magnetic and optical media disks, ever-increasing areal density translates into exacting requirements for disk cleaning and preparation. Defects resulting from improper, income-plete, or insufficient substrate buffing, polishing, cleaning, or other preparation produces decreased yield and increased time and cost.

By way of example, a microscopic contaminant of size on the order of 0.1 micron left on the surface of a hard drive disk substrate could cause the hard drive to fail, as the clearance between the drive head and the substrate magnetic media is only on the order of 0.0125 microns (0.5 micro-inches). Accordingly, the standard of cleanliness of hard drive substrates currently required in the Hard Drive industry is no more than 1 particle per side of size no greater than 0.1 micron. A greater number of contaminants, both in size or in number, will result in rejection of the substrate disk and a reduction in yield. This is extremely significant to this industry, as the cost to the consumer per megabyte of hard drive capacity, on the order of $40 per MB in 1985, is now on the order of <0.125 cents per MB, or <$1.25 per Gigabyte. With incredibly thin profit margins, it becomes essential that substrate cleaning systems, e.g., scrubber apparatus and methods, are fast, highly efficient and result in high yield of substrates that meet particulate cleanliness standards.

To meet the ever-increasing demands for cleaner substrates, both semiconductor and disk industries have adopted rotating brush scrubbing as the standard cleaning procedure. Each brush station includes one or more pair of brushes. The brush material is usually polyvinyl alcohol (PVA), but other materials such as mohair and nylon can be used. These systems are either single-substrate, one-at-a-time operations, or continuous streams, one-after-the-other.

A particularly leading-edge, continuous, brush cleaning system comprises a linear cascade of paired, counter-rotating brushes maintained on parallel spaced mandrels, in the nip of which are propelled the wafers or disks to be cleaned. These "Cascade Scrubber" systems are shown in U.S. Pat. Nos. 6,588,043 (wafer scrubbing) and 6,625,835 (hard drive disk substrate scrubbing), the subject matter of which are hereby incorporated by reference as if reproduced here to the extent required for completeness of disclosure of cascade scrubbing apparatus.

However, very small particles (less than 1 micrometer in size), lodge in the extremely fine crevices and trenches of the substrates. While cascade brush scrubbers alone can remove particles down to on the order of 0.1 micron, ongoing developments in the field of increasing hard drive areal density requires removal of even smaller particles. Ultra-fine particle dislodgement from the crevices and trenches is currently done in batches in ultrasonic and megasonic baths, either before the cascade scrubbing stage, after that stage, or both before and after (preferred), as the sonic energy can dislodge debris particles in the crevices. Once the particles are dislodged from substrate crevices by the sonic energy in the ultrasonic/megasonic baths they can be removed from the surface of the substrate by brush scrubbing.

Thus, in the present industry practice, there is alternating batch, continuous, batch cleaning operations that require special collection and handling devices and robot transfer system as the process operations switch from batch to continuous and back again. For example, in the Hard Disk substrate cleaning process, initial cleaning may be ultrasonic bath (batch), followed by cascade brush scrub (continuous), followed by megasonic bath (batch), followed by DI dip-and-pull drying (batch). At each change of process type, batch to continuous, there are special handling problems to resolve. As through-put rate requirements increase to meet output demands and to maintain cost margins, these process interface problems become more complex and costly to resolve.

Accordingly, there is a need in the art for a cleaning system that can keep up with the increasingly stringent requirements for substrate cleanliness, and can keep up with increased through-put demands by eliminating one or more interface problems. The invention meets this need in the art by providing apparatus and methods for simultaneous use of cascade brush scrubbing and sonic energy to clean wafer and disk surfaces.

THE INVENTION

Summary of the Invention

The present invention provides, in a single module, a total surface cleaning solution by combining a sonic particle dislodgement/removal assembly into a cascade brush scrubber line comprising a longitudinal array of rows of brush pairs in which the substrates process through preparation zones defined by each pair of brushes, the substrates being transited longitudinally while vertically oriented through the zones while rotating on an axis normal to their faces.

A piezoelectric transducer array transmits sound energy to one or both face(s) of the substrate to dislodge and/or remove particles, and the scrubber simultaneously or thereafter sweeps away the particulates. The sonic energy may be ultrasonic, megasonic, or both, applied to the substrate surface(s) in alternating or sequential process steps. The sonic energy is transmitted from the transducer(s) to the substrate surface(s) by one or more transmitter members, e.g., probes, rods, wands or fingers of suitable configuration (herein called members or wands), disposed on one or more sides of the substrate to be cleaned. Each sonic transmitter member is spaced slightly from the surface of the substrate in a non-contact position, and the resulting "meniscus" gap between the wand and the surface is filled or bathed with a fluid to maintain fluid coupling between the wand and the adjacent substrate surface in order to transmit the sonic energy to the surface and assist in carrying away dislodged particles.

In a presently preferred embodiment for cleaning HDD disk substrates, the disks are fed one after another into in the nip between the cylindrical brush pairs of the cascade scrubber. They are held vertically in each brush pair nip and are moved horizontally from station to station along the longitudinal array by a chain drive having pusher fingers secured thereto. The disk is also rotated in the direction of travel around the disk's central axis by an oppositely moving grooved belt that engages the edge of the disk. In the cascade scrubber, individual "stations" or zones are defined by gaps between pairs of brushes or brush segments. One or more sonic assembly(ies) is(are) disposed in one or more of those gaps, and a flow or spray of suitable fluid maintains the gaps filled with the energy transmitting fluid.

The preferred system employs one or more megasonic assemblies and the typical cleaning/rinsing fluid is water, or water supplemented with washing or rinsing agents such as TCL 300 and Morclean DN 30 manufactured by Oakite Corporation 50 Valley road, Berkeley Heights N.J. 07922 or Vltron SP2200 manufactured by Valtech Corporation, 2113 Santoga Station road, Pottstown, Pa. 19464. A continuous flow of DI water may be used to fill the coupling gaps between the substrate surfaces and the wand faces of the sonic assemblies, while the washing or rinsing agents may be used with the scrubbing brush assemblies.

A suitable magasonic assembly comprises one or more piezoelectric transducer(s) (PZT) secured to one or more transmitter member(s). The sound waves generated by the PZT transducer transmit through the transmitter member to the coupling liquid, reaches the substrate surface, dislodges the particles and passes through to the other side of the substrate. Cleaning liquid or water is sprayed from the upper part of the megasonic assembly or from a spray bar on top of the brush assembly to the interface gap between the megasonic transmitter member and the substrate surface.

The inventive system provides non-contact, high density sonic energy in close proximity to the substrate surface, being separated only by the narrow meniscus, coupling gap, rather than being diffuse through a large bath. The concentrated sonic energy also contacts the entire surface of the substrate since the substrates rotates as it passes through the sonic assembly gap. Note that the scrubber brushes support and maintain the substrates in a vertical orientation as the substrates are transported from the input end of the cascade scrubber assembly to the output end thereof. The brush diameter is selected to provide a lateral nip, that is, the nip between the spaced, side-by-side cylindrical brush elements as mounted on the respective scrubber mandrels that gives both good contact on both faces of the substrate as well as support the substrate in the vertical orientation. The brushes are typically an open cell PVA foam with sufficient resilience to compress slightly as the disk traverses the nip, provide enough scouring force to remove particulates without scoring the surface of the substrate.

The disks are moved longitudinally from the input end to the output end by a chain or belt drive that has pusher fingers terminating in rollers that contact the lower periphery of the disk. This drive assembly is located below the scrubber mandrels. In addition, the disk is rotated by a grooved belt centered below the nip. The substrate edge contacts the groove. Typically the grooved belt is driven in a direction opposite the direction of the chain/pusher drive. Thus, as the substrates traverse, say from left to right through the cascade scrubber assembly, the counter-rotating grooved belt impart a clockwise rotation to the substrates.

Further, the sonic energy is directed in a plurality of directions to the surface, including along the axis of the transmitter wand or fingers, and also normal to both the gap and the surface of the disk or wafer. In addition, since the wafers or disks travel longitudinally along the scrubber path through the gap, the sonic energy sweeps across an increasing area, herein called a "chord" of the substrate, from the edge to the center diameter or radius, and then a decreasing chord as the disk progresses through and leaves the transducer gap. At the same time, the disk is rotating, so the area swept out is more than a semicircle. Depending on the rate of rotation of the disk, the area contacted by each sonic assembly typically comprises multiple passes over the entire disk face, as the disk is resident in the sonic energy delivery assembly for about 16-20 full rotations as it traverses past sonic assembly wand(s).

By selection of the outer diameters of the cylindrical brushes and the nip between them, the mandrels on which the brushes are mounted are spaced laterally apart a distance sufficient to permit location of the probe or wand either vertically or horizontally (or at an inclined angle) adjacent or straddling the path of the substrate which passes down a center line equidistant between the longitudinal axes of the brush mandrels. The probes are on the order of 0.1"-0.5" in diameter or thickness and long enough to reach to at least the center of the substrate or the full diameter (5.25" in the case of a HD disk). The meniscus, fluid coupling, gap is on the order of about 0.1", but may be adjusted to provide the needed energy for cleaning.

In a presently preferred embodiment, a plurality of sonic assemblies can be used in a single cascade scrubber line. In a typical cascade scrubber, there are 5-10 zones defined by 5" long scrubber brushes, each defining a zone, spaced apart by a gap of 0.7". The brush lengths and gaps may be any suitable length to provide the scrubbing required for the level of particle removal needed. The sonic assemblies are placed in the gaps between the brush zones, and may extend vertically from the top down to the mid-point of the substrate wafer or disk, or may extend all the way down to the bottom edge. In a first sonic zone, located between scrubber brush zones 1 and 2, the sonic energy can be ultrasonic. In sonic zone #2, disposed between brush zones 2 and 3, the sonic energy can be megasonic, and so on through the entire length of the scrubber path. Sonic energy can be provided from both sides, so long as the sonic waves do not cancel due to the geometry of the sonic assembly, the width of the meniscus gap, and the sonic parameters, including the energy level of the sonic waves (in watts), the wavelength and frequency. Thus, for example, the sonic transducers may be advantageously placed in staggered arrays (non-coaxial) in the wands on opposite sides of the disk. In the alternative, the sonic source can be provided from one side in sonic zone 1, and the opposite side in zone 2, and both in zone 3. That is, the energy, frequency, wavelength and the duration, extent of coverage and which side(s) sonic energy is delivered can be selected for a wide range of cleaning efficacy. Following these principles, one skilled in the art can easily arrange the sonic and brush zones to achieve a desired level or standard of cleanliness.

In another embodiment, the wand or probe may be oriented horizontally, with its axis generally parallel to and between the axes of the brush mandrels, and preferably located vertically along the mid-line (the horizontal diameter) of the substrate. The transducer may be located at one end of the wand, or the wand may be T-shaped, with the transducer located on or in the stem of the T. Thus, in this embodiment the sonic assembly is in the form of an inverted T disposed in the gap between brush pair zones, parallel to the center line of the cascade scrubber assembly and spaced to permit the sonic coupling gap as the substrate passes by.

Thus, the inventive system is modular, flexible and highly configurable. Likewise, the process of simultaneous and sequential cleaning in a single module by both sonic and brush scrubbing is easily tailored to a wide variety of process step combinations and allows rapid installation and configuration to upgrade previously installed cascade scrubbers. The inventive system may also result in eliminating one or more downstream batch sonic baths, thereby improving throughput and yield. The inventive system is highly adapted to continuous single wafer and disk processing, is scalar, in that multiple lines can run simultaneously in parallel, and by control of the substrate horizontal movement rate and the rate of rotation, the dwell time in each sonic and/or scrub zone can be controlled. The high density, close proximity sonic energy application reduces sonic dwell time to within the time available between the scrub zones. That is, since the substrate must traverse the scrubber line, the inventive process delivers a way to use the time between zones to do additional ultra-fine particle dislodgement and flushing.

In the case of wafers, the sonic energy may transfer from the transmitter member through the fluid coupling meniscus of water or cleaning fluid, thence to the wafer and through the back side. Thus a single-sided wand or finger (no double gap; single gap on one side) may be sufficient to clean both sides. In the alternative, different zones may clean from different sides, or in the case of double-side cleaning, the wands on each side may be axially off set, say by a few degrees to 180°. For example, in a single zone, Wand A on a first side, Side A, may be top-mounted to cover the top half of the substrate, and Wand B on the other side, Side B, may be bottom-mounted to cover the bottom half of the substrate. Thus, the substrate as it rotates is cleaned alternately from opposite sides.

The sonic assemblies may be disposed in all or fewer of the inter-zone gaps. That is, the brush elements are spaced along the mandrel, and the spaces comprise inter-zone gaps where the sonic assemblies are disposed. In accord with the principles of the invention, from about 10% to about 100% of the inter-zone gaps may contain sonic assemblies. Thus, there may be no sonic cleaning applied between one or more scrubber zones, and no scrubbing between one or more sonic zones. For example in a 5-zone scrubber, there may be no sonic wands between Zones 1 and 2, and between Zones 2 and 3. The sonic wands may be provided between Zones 3 and 4, and between Zones 4 and 5. In the alternative, the first half of the line can be scrubber brushes with no ultrasonic or megasonic, and the second half can be all sonic. Exemplary of a hybrid configuration would be no sonic between Zones 1 and 2 and 2 and 3, Zone 4 is a half-sized (long) zone, and sonic assemblies are positioned on one or both sides in the remaining half of Zone 4, or into part or all of scrubber brush Zone 5.

The flow of fluid provides a fluid coupling through which the sonic energy is propagated, and this energy can provide backside cleaning by transmission through the substrate. Sonic sweep is provided across the entire radius and/or diameter, and progresses from an edge across a chord and back to the opposed edge. The rate of rotation or spin of the substrate can be controlled to provide single-pass particle dislodgement and carry-off. For example, in the preferred embodiment, the transit time for a substrate through the sonic assembly disposed in an inter-zone brush gap is on the order of 4 seconds, while the grooved rotational drive belt rotates the substrate at 4 rpm. The result is that the substrate makes 16 complete rotations during transit through the sonic assembly that straddles the substrate. Contaminant particles are carried off not only by the flow of the coupling fluid but also by the centrifugal force of the substrate spin and by the action of the brushes in the next, downstream brush zone. A "wave-front" of water forming a higher meniscus line or hump can build up on the leading edge of the wand (the edge facing the input end of the line) as the disk or wafer advances past the wand.

As noted in our U.S. Pat. No. 6,625,835 the multiple brush zones can include individual sumps and individual chemistry for cleaning, and the present invention takes advantage of that functionality of cascade scrubbers for flexibility in configuration of the inventive process. One example of a megasonic probe suitable for single-sided use with silicon wafers is shown in U.S. Pat. No. 6,295,999 (10-2001).

In one embodiment, the transmitter wand or finger can be a stainless steel or quartz rod having a round cross section or it can have a flat face facing the substrate surface. The transducer assembly may comprise a circular piezoelectric material bonded to an aluminum cylinder or directly to the transmitter member. The transducer and Al cylinder are secured to one end of the rod and that end is disposed in a housing that can include a heat exchanger to remove excess heat generated by excitation of the transducer. The transmitter member (probe or wand) extends out the housing into proximity with the substrate to be cleaned. The piezoelectric transducer is electrically excited to vibrate at high frequency, and the coupled transmitter member carries the high frequency energy into the coupling liquid film. The sound frequency, e.g., 830 MHz, is transmitted from the transducer through the quartz rod to the liquid meniscus and finally to the substrate. The imploding cavitation bubbles created in the fluid by the sound energy dislodges the fine particulates trapped in the crevices of the substrate. As the substrate is rotated, the axial and radial components of the transmitter can be controlled by control of input to the piezoelectric material. The thickness of the fluid meniscus can be varied by control of the distance of the transmitter wand or finger to the substrate surface. In turn this provides control of the amount of energy delivered to the substrate. Thus, control of fluid type, amount and rate of fluid flow, sonic frequency, input to the piezoelectric material, rate of substrate rotation, length of wand, dwell time in the gap (rate of horizontal travel and/or rotation of the substrate) and gap thickness are all possible, providing a wide range of parameters for process control.

The transmitter member may be any suitable material considering the vibration frequency and the chemistry of the cleaning fluid in contact with it. Examples include: stainless steel, quartz, sapphire, aluminum, vitreous ceramic, cermets, silicon nitride, glass, boron nitride, vitreous carbon, silicon carbide, vitreous or glassy carbon-coated graphite or graphite nanotubes, or other suitable materials. Where the transmitter member material is a composite, the bonding agent must be adequate to prevent delamination at the frequencies employed.

Preferably, the radius or thickness of the transmitter member should be equal to or smaller than the acoustic wavelength generated by the transducer. The member length may be selected to be $n\lambda$, where $\lambda$ is the acoustic wavelength, and n is a whole number. The base of the transmitter member may be enlarged to provide for a larger transducer and heat-sink, and the tapering of the transmitter member from an enlarged base to a smaller rod or wand form concentrates the energy. In an alternative, multiple small transducers can be bonded in an array to a portion of the transmitter member, or to an intermediate heat sink or other energy transfer structure, or along substantially the entire length of the transmitter member. Such a multiple, small transducer array can serve to selectively localize and deliver sonic energy to the substrate(s) as they approach and pass the transmitter member.

BRIEF DESCRIPTION OF THE DRAWINGS

The invention is described in more detail with reference to the drawings, in which.

DETAILED DESCRIPTION, INCLUDING THE BEST MODES OF CARRYING OUT THE INVENTION

The following detailed description illustrates the invention by way of example, not by way of limitation of the scope, equivalents or principles of the invention. This description will clearly enable one skilled in the art to make and use the invention, and describes several embodiments, adaptations, variations, alternatives and uses of the invention, including what is presently believed to be the best modes of carrying out the invention.

In this regard, the invention is illustrated in the several figures, and is of sufficient complexity that the many parts, interrelationships, and sub-combinations thereof simply cannot be fully illustrated in a single patent-type drawing. For clarity and conciseness, several of the drawings show in schematic, or omit, parts that are not essential in that drawing to a description of a particular feature, aspect or principle of the invention being disclosed. Thus, the best mode embodiment of one feature may be shown in one drawing, and the best mode of another feature will be called out in another drawing.

All publications, patents and applications cited in this specification are herein incorporated by reference as if each individual publication, patent or application had been expressly stated to be incorporated by reference.

Figure 1:
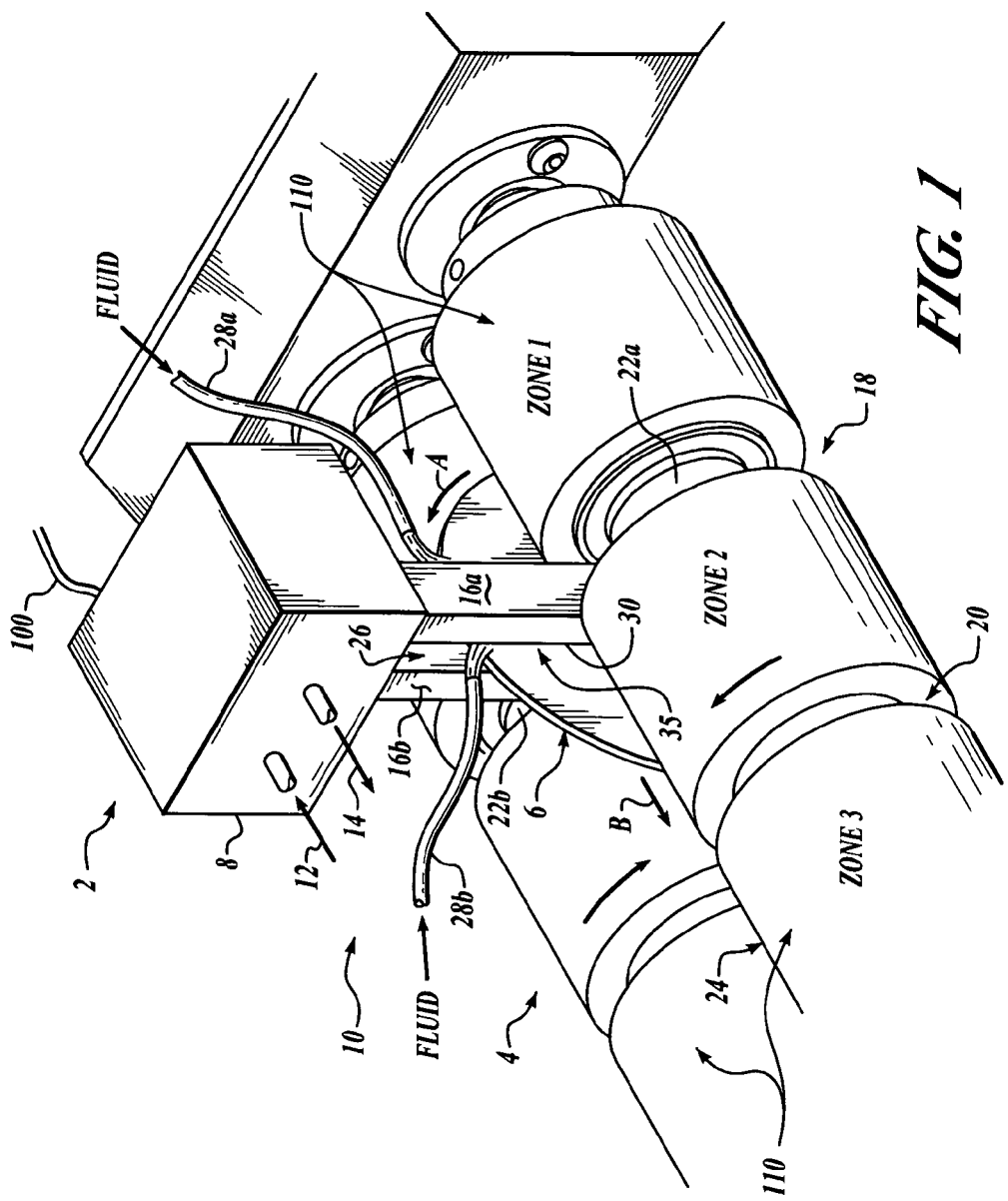
FIG. 1 is an isometric rendering of one exemplary embodiment of the inventive integrated megasonic cascade scrubber assembly showing a vertical megasonic assembly having a pair of spaced, parallel transmitter members disposed in a gap between Zones 1 and 2 of a cascade scrubber line.
Figure 5:
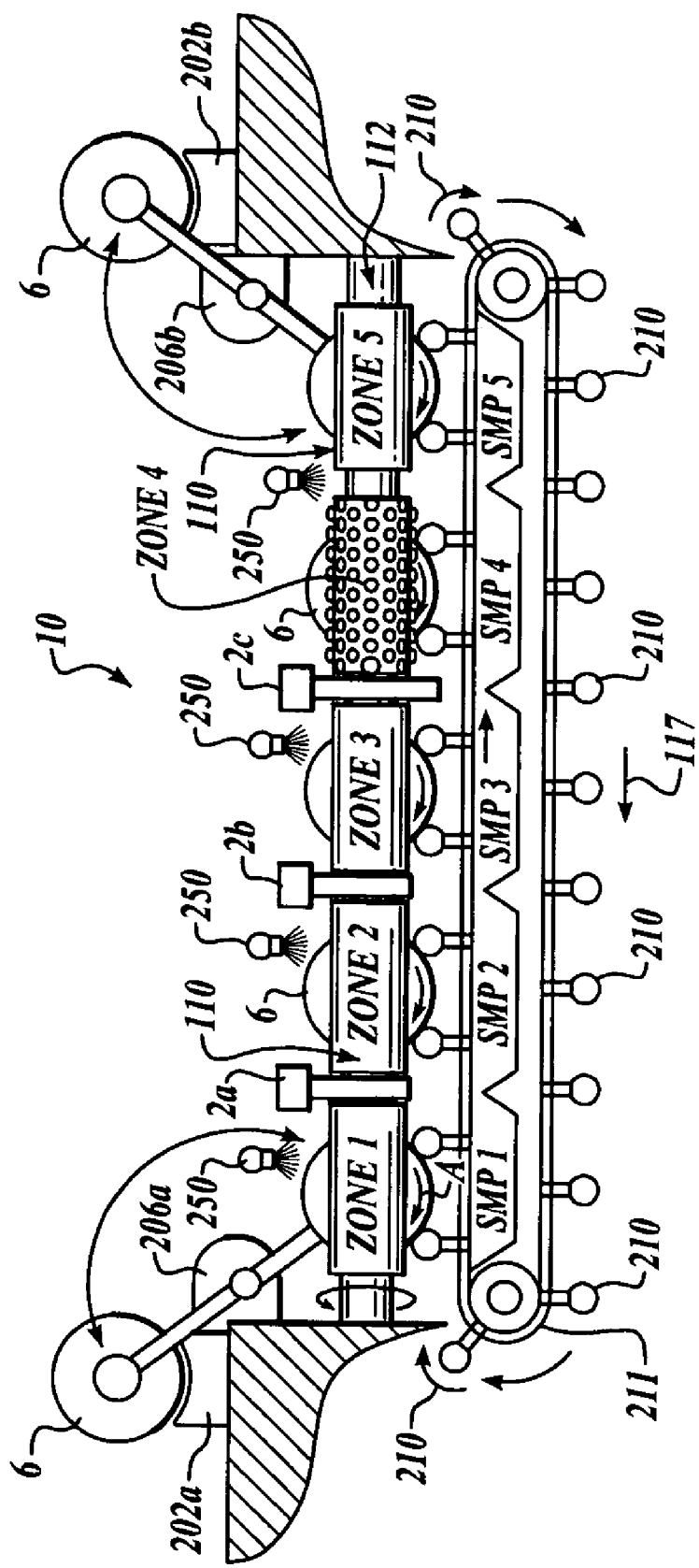
FIG. 5 is a schematic elevation view of one layout of another embodiment of the inventive integrated megasonic cascade scrubber module showing multiple scrub and sonic zones and fluid sumps.

FIG. 1 is an isometric rendering of one exemplary embodiment of the inventive integrated sonic cascade scrubber assembly 10 comprising a sonic energy sub-assembly 2 and a cascade scrub-ber sub-assembly 4. The cascade scrubber assembly comprises a series of pairs of counter rotating brushes mounted on mandrels 22a, 22b. The brush pairs 110 are spaced apart longitudinally along the mandrels to form Zones 1, 2, 3 as shown. The Zones are separated by intra-zone gaps 18 and 20. A vertically oriented megasonic assembly 2 is shown disposed in gap 18. An HDD disk 6 is shown in the brushes nip 24, and it is rotating in the direction of arrow A, while being translated along the brush cascade line in the direction of Arrow B. The brushes support the substrate disk 6 in a vertical orientation as it moves laterally and rotates. (FIG. 5 shows the drive chain 211 and pusher fingers 210 that transport the substrate from the input end, Zone 1, to the output end, Zone 5.) As shown in FIG. 1, the disks are simultaneously rotated as shown by the Arrow A by a counter-rotating grooved belt (not shown, but see our U.S. Pat. No. 6,625,835 for details) directly below the nip 24 that receives the edge of the substrate disk 6. The ultrasonic or megasonic assembly 2 includes a housing 8 in which is located the transducer electrically powered through leads 100, and fluid cooled through input tube 12 and exhaust tube 14. The sonic assembly has a pair of spaced, parallel transmitter members 16a, 16b, resembling a tuning fork, disposed in the gap 18 between Zones 1 and 2 of the cascade scrubber line. The disk 6 is shown in mid-transit through the gap 26 between the members 16a, 16b. Coupling fluid delivery tubes 28a and 28b deliver coupling fluid to the meniscus coupling gap 35 (best seen in FIG. 3) between the substrate disk faces 30 and the inside faces of the transmitter members to provide an acoustic energy transfer interface where the cavitation bubbles and vibratory dislodgement of the microscopic contaminant particulates occurs.

Figure 2:
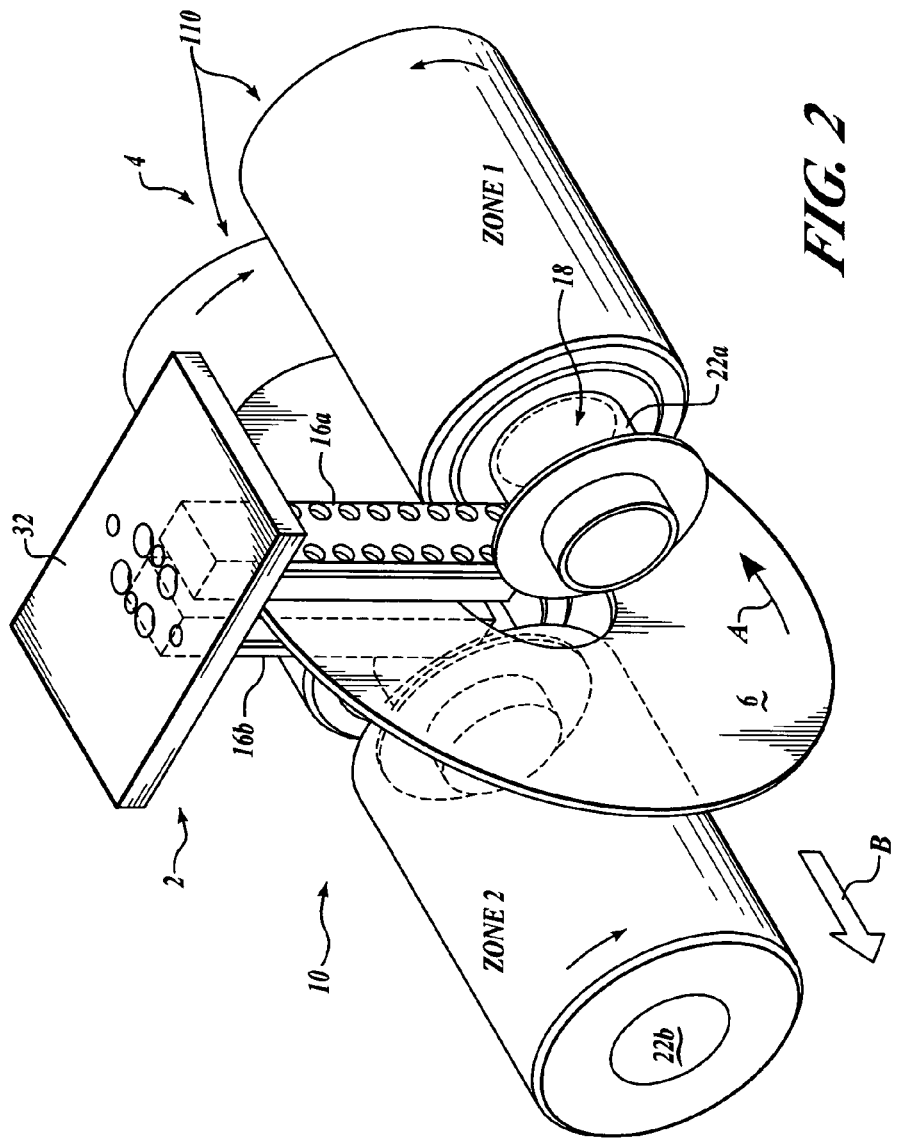
FIG. 2 is an isometric line drawing revealing the hidden features of the inventive integrated assembly of FIG. 1.
Figure 3:
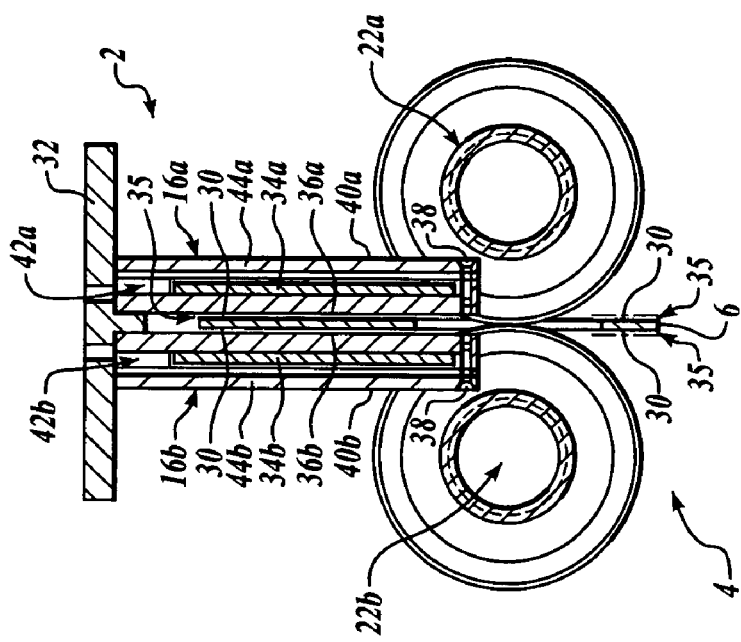
FIG. 3 is a vertical, transverse cross-section through the center of the assembly of FIGS. 1 and 2.

FIG. 2 is an isometric line drawing revealing the hidden features of the inventive integrated assembly of FIG. 1. The numbering of parts is the same as in FIG. 1. In this figure, the housing 8 has been removed to reveal the transducer plate 32 to which the transducer is bonded, and the forks of the transmitter members 16a, 16b are secured. The forks are hollow as best seen in FIG. 3. The forks comprise, in horizontal cross-section (as seen from the top, back to back, spaced U-shaped channels,] [, having an exterior closure plate. The vertical array of circles shown in the transmitter member 16a (one fork) represent fasteners to secure the exterior closure plate 44a to the U-shaped channel 42a in which is located a strip transducer (see FIG. 3).

Figure 4:
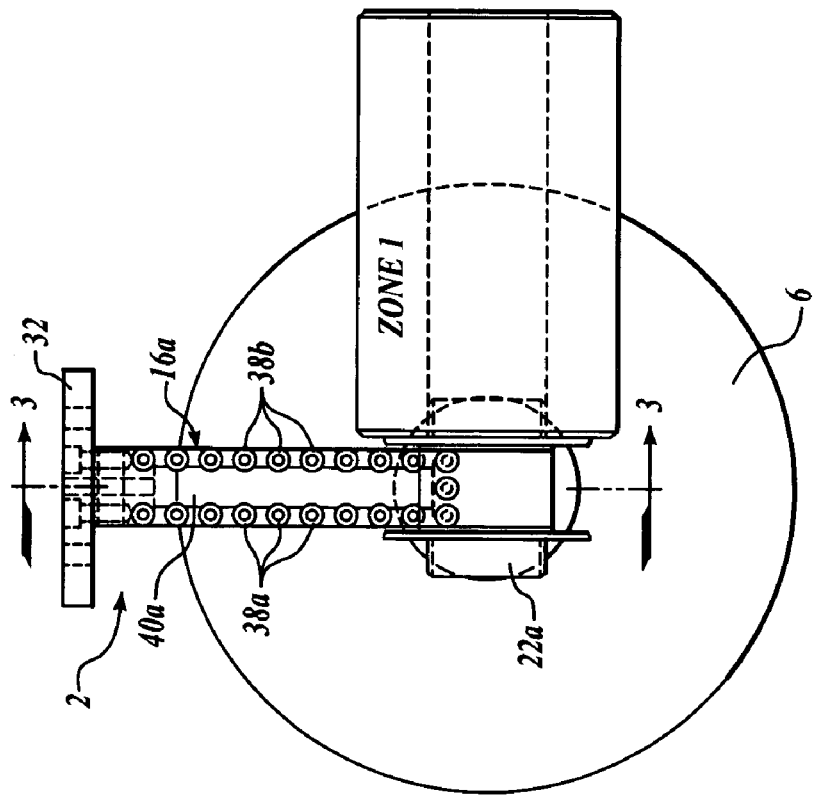
FIG. 4 is a vertical, longitudinal elevation view of the assembly of FIGS. 1-3 with parts broken away.

FIG. 3 is a vertical, transverse cross-section through the center of the assembly of FIGS. 1 and 2 taken along line A-A in FIG. 4 and shows a third embodiment in which elongated strip transducers 34a and 34b are located in hollow legs 16a, 16b of the transmitter formed by channels 42a, 42b and closure plates 44a, 44b. These transducer elements are bonded inside the hollow leg to the inside faces 36a and 36b (the connector portion of the channels), respectively.

FIG. 4 is a vertical, longitudinal elevation view of the assembly of FIGS. 1-3 with parts broken away, showing fasteners 38 securing the outer face 40a of the legs 16a.

FIG. 5 is a schematic elevation view of one layout of the inventive integrated megasonic cascade scrubber modules 100 showing multiple zones and fluid sumps. A plurality of cylindrical brush pairs 110 are mounted along spaced mandrel pair 112. The brushes are comprise preparation surfaces and are configured to scrub or prepare substrates 108 as they progress along the plurality of roller brushes from one Zone to the next. Five numbered zones 1-5 are identified. By way of example, Zone 4 comprises radial brush circles or dots to provide a unique cleaning action.

A pick and place indexing robot mechanism 206a picks the disk 6 out of an input cassette 202a and places it in the nip of the brush roller pair of Zone 1, where the disk is engaged between a pair of pusher fingers 210 terminating in rotating edge wheels, attached to drive belt 211 moving clockwise 117 to move the disk 108 from the input, dirty end (Zone 1) of the integrated megasonic/cascade scrubber assembly 10 to an output, clean end (Zone 5) where a second pick and place robot 206b removes the disk 108 and places it in a suitable receiving cassette 202b. Note that a plurality of disks are continuously in transit in the megasonic/cascade scrubber module. Sumps SMP 1 through SMP 5, corresponding to Zones 1 through 5 lie directly below the Zone 1 through Zone 5 brush pairs to collect the fluid dispensed through the brushes and from the sprayers 250, so as to prevent cross contamination from the upstream dirtier zones into the downstream cleaner zones. Downstream sumps can flow into the upstream sumps, if desired.

A plurality of sonic assemblies 2a, 2b and 2c are shown disposed between zones. The scale of the drawing is such that the fluid conduit providing flow of coupling fluid to the sonic transmitter arms is not shown, but it should be understood to be present. The sonic assembly 2a may be ultrasonic, while 2b and 2c may be megasonic, or all three may be megasonic. Note that by way of example, the transmitter arms of the sonic units 2a and 2b extend to the middle of the disks, while that of 2c extends the entire diameter of the disk.

INDUSTRIAL APPLICABILITY

It is evident that the inventive integrated sonic cascade scrubber system and methods, by incorporating both sonic and brush scrubbing in a single, continuous operation module will speed up production and provide better cleaning to more stringent standards that multiple modules requiring handling between the sonic function and the brush scrubbing function. Accordingly, the inventive system is widely applicable to wafer and HD disk cleaning.

It should be understood that various modifications within the scope of this invention can be made by one of ordinary skill in the art without departing from the spirit thereof and without undue experimentation. This invention is therefore to be defined by the scope of the appended claims as broadly as the prior art will permit, and in view of the specification if need be, including a full range of current and future equivalents thereof.

The invention claimed is:

1. Apparatus system for preparation of disk-shaped substrates having opposed, generally planar faces that require cleaning in preparation for fabrication of computer chips and storage device media, comprising in operative combination:
   a) a cascade scrubber assembly having a pair of rotatable, laterally spaced, longitudinally extending mandrels, the axes of which are oriented in parallel relationship, each of said mandrels having mounted thereon a plurality of spaced cylindrical brush elements to form a plurality of brush pairs from a first input end of said scrubber assembly to an output end, said brush pairs are spaced apart from each other along the respective axes of said mandrels; said brush pair being dimensioned to provide a lateral nip therebetween for vertically supporting said substrate disk and for contacting said substrate faces, each said brush pair defining a substrate cleaning zone that is spaced from a sequentially-adjacent brush element pair, each of said brush pair spacings defining an inter-zone gap along said mandrels, a first drive mechanism to transport said substrates disks along said brush pair nips from said input end to said output end of said cascade scrubber assembly, and a second drive mechanism for rotating said substrates as they are transported from said input end to said output end of said cascade scrubber assembly;
   b) at least one sonic particle dislodgement assembly disposed in at least one of said inter-zone gaps, said sonic assembly including at least one transducer and at least one transmitter member having an output surface for delivery of sound energy, selected from ultrasonic and megasonic energy, to at least one surface of a substrate in fluid-coupled association therewith;
   c) a conduit for supply of fluid to at least one output surface of said sonic assembly to provide a fluid for coupling between said sonic assembly output surface and at least one face of said substrates; and
   d) said apparatus providing sequential scrubbing and microscopic particle dislodgement from at least one surface of said substrates as said substrates are moved along said scrubber assembly from said input end to said output end of said cascade scrubber assembly.

2. Apparatus for preparation of substrates as in claim 1 wherein said sonic assembly comprises an array of transducers and said transmitter member output surface is disposed spaced from said disk surface to provide a meniscus coupling gap for said fluid coupling to said disk surface as said substrate disk is transported adjacent thereto.

3. Apparatus for preparation of substrates as in claim 2 wherein a sonic assembly is disposed in each said inter-zone gap of said cascade scrubber assembly.

4. Apparatus for preparation of substrates as in claim 2 wherein a sonic assembly is disposed in from about 10% to about 50% of said inter-zone gaps of said cascade scrubber assembly, said gaps being selected from alternate gaps and gaps disposed in the downstream portion of said cascade scrubber assembly.

5. Apparatus for preparation of substrates as in claim 2 wherein said transmitter member extends from the outer edge of said substrate to at least about the center of said substrate.

6. Apparatus for preparation of substrates as in claim 2 wherein said fluid is selected from DI water and water supplemented with a washing or rinsing agent.

7. Apparatus for preparation of substrates as in claim 1 wherein a plurality of sonic assemblies are disposed adjacent the path of said substrates as they traverse the scrubber nips from said input end to said output end and at least one of said sonic assemblies is in fluid coupling with one face of said substrate and at least one other sonic assembly is in fluid coupling with the opposite face of said substrate.

8. Apparatus for preparation of substrates as in claim 1 wherein a plurality of sonic assemblies are disposed adjacent the path of said substrates as they traverse the scrubber nips from said input end to said output end, and at least one of said sonic assemblies is in fluid coupling with both faces of said substrates to deliver sonic energy to said both faces simultaneously.

9. Apparatus for preparation of substrates as in claim 1 wherein said sonic assembly includes a pair of transmitter members disposed with a space between said members, said space defining a slot including opposed faces of said transmitter members spaced apart a distance sufficient to permit passage of a substrate disk therebetween, and to provide a fluid coupling meniscus gap between each transmitter member face and a substrate face.

10. Apparatus for preparation of substrates as in claim 9 wherein each said transmitter member includes a plurality of transducers in an array to provide full coverage of said substrate face along a radius thereof.

11. Apparatus for preparation of substrates as in claim 1 wherein said sonic assembly includes fluid conduits for providing cooling fluid heat exchange internal of said assembly.

12. A continuous cascade scrubber having a plurality of spaced scrubber zones, comprising in operative combination:
   a) a plurality of pairs of adjacent counter-rotating brushes, defining brush pairs;
   b) said brushes being mounted along a pair of rotatable, laterally spaced, longitudinally extending mandrels, the axes of said mandrels being oriented in parallel relationship;
   c) said brush pairs being spaced apart by a plurality of gaps spaced longitudinally along said mandrels, the brush pair between successive gaps defining a scrubber zone, and adjacent scrubber zones being spaced apart by a gap; and
   d) at least one sonic energy-delivering assembly disposed in at least one said gap.

* * * * *